United States Patent
Dangelmaier et al.

(10) Patent No.: US 7,786,577 B2
(45) Date of Patent: Aug. 31, 2010

(54) COMPONENT WITH CHIP THROUGH-CONTACTS

(75) Inventors: Jochen Dangelmaier, Beratzhausen (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 120 days.

(21) Appl. No.: 11/536,336

(22) Filed: Sep. 28, 2006

(65) Prior Publication Data

US 2007/0069376 A1    Mar. 29, 2007

(30) Foreign Application Priority Data

Sep. 29, 2005    (DE)    ........................ 10 2005 046 737

(51) Int. Cl.
*H01L 23/48*    (2006.01)
*H01L 23/52*    (2006.01)
*H01L 29/40*    (2006.01)

(52) U.S. Cl. .............. 257/734; 257/690; 257/E21.505; 257/E21.705; 438/411; 438/461

(58) Field of Classification Search ................ 257/734, 257/690, E21.505, E21.705; 438/108, 411, 438/461, 611
See application file for complete search history.

(56) References Cited

U.S. PATENT DOCUMENTS 6,396,148 B1 *    5/2002    Eichelberger et al. ....... 257/758
6,759,738 B1 *    7/2004    Fallon et al. ................. 257/690
2002/0003303 A1    1/2002    Pommer et al.
2002/0042164 A1    4/2002    Funaya et al.
2002/0074637 A1    6/2002    McFarland
2002/0130404 A1    9/2002    Ushijima et al.
2003/0003724 A1    1/2003    Uchiyama et al.
2004/0121521 A1 *    6/2004    Jackson et al. .............. 438/108
2004/0159462 A1 *    8/2004    Chung .......................... 174/259
2004/0207049 A1 *    10/2004    Bauer et al. ................. 257/620
2005/0098871 A1 *    5/2005    Fuergut et al. .............. 257/690
2006/0087044 A1 *    4/2006    Goller ......................... 257/783

FOREIGN PATENT DOCUMENTS

| DE | 10065896 A1 | 5/2002 |
| DE | 10127009 A1 | 12/2002 |
| DE | 10148043 A1 | 1/2003 |
| DE | 103 20 579 | 8/2004 |
| DE | 10352946 A1 | 6/2005 |

\* cited by examiner

*Primary Examiner*—Cuong Q Nguyen
*Assistant Examiner*—Cathy N Lam
(74) *Attorney, Agent, or Firm*—Dicke, Billig & Czaja, PLLC (57) ABSTRACT

A panel for the production of electronic components is disclosed. The components have a substantially planar semiconductor chip with chip through-contacts which are provided with electrically conductive material. A rewiring region is subdivided into an insulating layer and also a first rewiring arranged therein, the rewiring projecting laterally beyond the side edge of the planar semiconductor chip. The rewiring has external contacts for electrical connections toward the outside. The panel provides a filling layer made of plastic, which encapsulates the semiconductor chip in a side region between the chip front side and the chip rear side and which is connected to the rewiring region.

14 Claims, 5 Drawing Sheets

COMPONENT WITH CHIP THROUGH-CONTACTS

CROSS-REFERENCE TO RELATED APPLICATIONS

This Utility Patent Application claims priority to German Patent Application No. DE 10 2005 046 737.7 filed on Sep. 29, 2005, which is incorporated herein by reference.

BACKGROUND

The invention relates to panels for the production of electronic components, the panel having component regions from which a respective component can be separated.

The invention furthermore relates to components produced from such a panel, and to methods for the production of such panels and components.

A method for the production of such panels and components is disclosed in DE 103 205 79 A1, in DE 101 270 09 A1 and in DE 101 480 43 A1. The components thus produced cannot be used for all forms of application.

Components with rewirings are disclosed in US 2002/0074637 A1, in US 2004/0121521 A1, in US 2002/0130404 A1, in US 2002/0042164 A1 and in US 2002/0003303 A1.

DE 101 480 43 A1 illustrates a method for the production of an electronic component with a plastic housing and components of a leadframe. For this purpose, a panel with height-structured islands is provided, in the case of which a semiconductor chip is respectively arranged on chip islands in component positions.

DE 101 270 09 A1 relates to a plastic housing with a plurality of semiconductor chips, and also a rewiring plate, on which the semiconductor chips are arranged. Using the rewiring plate and an injection mold, a plastic housing for a plurality of electronic components is made possible.

DE 103 20 579 A1 illustrates a panel with a plurality of electronic components having a stack of two semiconductor chips, through-contacts to a rewiring layer being provided in an edge region of one semiconductor chip.

US 2002/0074637 A1 illustrates a stacked flip-chip arrangement with lateral rewirings.

US 2004/0121521 A1 illustrates rewiring lines from the active surface of a semiconductor substrate to the rear side thereof. The semiconductor substrate has through-contacts with conductive material.

For these and other reasons, there is a need for the present invention.

SUMMARY

One embodiment provides a panel for the production of electronic components. In one embodiment, the components have a substantially planar semiconductor chip with chip through-contacts which are provided with electrically conductive material. A rewiring region is subdivided into an insulating layer and also a first rewiring arranged therein, the rewiring projecting laterally beyond the side edge of the planar semiconductor chip. The rewiring has external contacts for electrical connections toward the outside. The panel provides a filling layer made of plastic, which encapsulates the semiconductor chip in a side region between the chip front side and the chip rear side and which is connected to the rewiring region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides for improving the known components and methods for the production thereof in such a way as to enable low-defect production of large scale integrated circuits which can be used even under confined space conditions.

In one embodiment, a panel according to the invention for the production of electronic components has component regions from which a respective component can be separated. That is to say that the electronic components are produced in a parallelized batch process in order to minimize production outlay.

The components are provided in particular for fixing on a substrate. However, the components can also be both electrically and materially connected to other electronic components such as flip-chips, wire bonding chips, SMD components, discrete or passive components and also to finished processed housings having different forms and functionalities.

The component regions of the panel in each case have a semiconductor chip and at least one rewiring region. The semiconductor chip has a chip front side with active circuit structures—for example analogue or digital circuits—, a chip rear side and one or more chip through-contacts. The chip through-contacts extend between the chip rear side and the chip front side and are provided with electrically conductive material—such as copper, aluminum, tungsten, tin, gold or an alloy including these materials. They may also be completely filled with such a material. The rewiring region may be provided at the chip rear side. As an alternative to this, the rewiring region may be provided on the chip front side. In the case of a component having a very high packing density, it is also possible to provide a plurality of rewiring regions, for example on the chip front side and on the chip rear side. The rewiring region is subdivided into at least one insulating layer and also a rewiring arranged therein and has external contacts for electrical connections to the substrate or to other electronic components. Solder balls such as are used in a ball grid array housing may be used as connecting elements in this case. However, the connecting elements may also be embodied in the form of flat solderable structures, as is the case in a land grid array housing. The use of connecting elements of the latter type is advantageous particularly when there is a high degree of spatial limitation.

The rewiring has horizontal conductor track regions and at least one through-contact, the horizontal conductor track regions having sputtered or galvanically grown copper or aluminum, gold, tin or an alloy including these materials. These materials can be easily applied and patterned and have a high electrical conductivity.

In this case, the rewiring makes contact with one or more chip through-contacts, so that contact can be made with both sides of the semiconductor chip via an external contact on one side of the semiconductor chip. This enables a flexible connection configuration. Moreover, the semiconductor chip situated in the component can be tested for functionality directly via the external contacts without the electrical contacts of the semiconductor chip being damaged in the process by being touched with a needle card. A loss of yield, associated with incorporation of a defective semiconductor chip into a module, can thereby be avoided.

Such contact-making elements such as solder balls or contact bumps may optionally be provided between the rewiring and the semiconductor chip. The contact-making elements may be advantageous for reducing thermomechanical stresses occurring between the semiconductor chip and the rewiring.

Furthermore, the panel has a filling layer, which is connected to the rewiring region and encapsulates the semiconductor chip in a side region between the chip front side and the chip rear side. When the component is separated from the panel by sawing, the filling layer remains as lateral protection of the semiconductor chip around the semiconductor chip between the upper and lower rewiring regions. In this case, the side areas of the protective layer have sawing tracks produced in the course of separating the components from the panel by sawing. This affords an indirect indication of whether the method according to the invention has been used for the production of the component.

One or more of the external contacts may be configured in such a way that they project at least partly laterally beyond the edge of the chip front side and/or chip rear side. This is advantageous primarily in order to realize the fan-out structure. In the case of fan-out structures, distances between the external contacts are greater than the distances between the contacts on the chip front side of the semiconductor chip. This results in better external contact-making possibilities for the electronic component.

The external contacts have an additional copper-tin or nickel-gold surface coating. As an alternative, the external contacts may have gold or tin coating. The external contacts may optionally be provided with an additional organic layer. The organic layer or the organic surface protection—abbreviated to OSP—protects the surface coating of the external contacts from oxidation without impairing the processability of the contacts in the process. This is because the organic layer volatilizes with an increase in temperature caused by soldering or bonding at external contacts, whereby the surface of the external contacts that is to be soldered or bonded is uncovered.

Individual electronic component regions can be separated from the panel by sawing in accordance with the invention, so that the component regions produce the components according to the invention with through-contacts and with rewirings. A plurality of such semiconductor chips provided with the rewiring regions may also be combined together with other electronic components in a housing according to the system-in-package principle. However, they may also be stacked one on top of the other as finished component housings, be equipped with other external components or be inserted into a semiconductor module.

The rewiring regions situated on the chip front side and/or on the chip rear side may, for their part, serve as substrates for mounting one or more further housings or semiconductor chips. This results in a high degree of flexibility particularly when stacking semiconductor housings and also when constructing semiconductor modules with individual semiconductor housings, with individual semiconductor components and/or with passive electrical components.

The method according to the invention for the production of the panel according to the invention having a multiplicity of component regions has the following steps:

A first process involves providing a carrier substrate equipped with semiconductor chips, the semiconductor chips each having a chip front side with active circuit structures, a chip rear side and one or more chip through-contacts which extend between the chip rear side and the chip front side and which are provided or filled with electrically conductive material, and are fixed to the carrier substrate by means of an adhesive, the adhesive strength of which decreases upon heating. In this case, the semiconductor chips may be adhesively bonded on the carrier substrate by their chip front side. As an alternative to this, the semiconductor chips may be adhesively bonded on the carrier substrate by the chip rear side. The essential process would not change as a result of this.

The use of the thermally active adhesive layer enables the substrate to be easily removed from the panel by heating the adhesive layer in a later process step without the panel and the semiconductor chips embedded in the panel being exposed to mechanical loading in the process.

A second process involves filling the space between the semiconductor chips with a filling layer—preferably in a film molding method. In this method, a direct mechanical contact between the semiconductor chips and the mold is avoided by using a plastic film. The plastic film is placed on the inner area of the mold and provides, on the one hand, for sealing the semiconductor chips from above in order that the filling layer does not reach the upper area of semiconductor chips. On the other hand, the plastic film ensures that the mold does not damage the semiconductor chips.

After molding, on the upper area of semiconductor chips, which corresponds to the chip rear side if the semiconductor chips are placed by the chip front side on the substrate provided with the adhesive layer, and on the upper area of the plastics composition that terminates flush with the chip surface, rewiring regions with individual layers of the rewirings, through-contacts and insulating layers are built up layer by layer using thin-film technology in the build-up method.

Thin-film technology permits a diverse configuration of the rewiring regions even if the external contacts project beyond the contours of the semiconductor chip in this case.

Photosensitive layers are usually used as insulating layers in this case, the photosensitive layers being applied by spin-coating and being patterned photolithographically. The conductor track regions are deposited by sputtering or by vapor deposition. As an alternative, the conductor track regions may be grown galvanically on a sputtered intermediate layer. They are then patterned by etching. In the case of these build-up techniques, the constitution of the rewiring remains largely planar, thereby facilitating further processability of the rewiring and also its population by further electronic elements.

In the simplest embodiment of the rewiring, the mounting contacts may be fitted directly on the chip rear side, for example by means of a firstly whole-area rear-side metallization with subsequent photopatterning on a semiconductor wafer. In this embodiment, only the area of the semiconductor chip can be utilized for stacking and a fan-out cannot be realized either. However, the one or more insulating layers otherwise provided in the rewiring region is or are obviated.

In a further process, the external contacts of the rewiring region are provided with a solderable surface. The external contacts may optionally be covered with an additional organic protective coating.

In a final process, the chip front sides are uncovered for further processing by heating the carrier substrate after the overall construction has been rotated in a handling device.

In an optional further process, the chip front sides are provided with a further rewiring region. Since the construction of this further rewiring region essentially corresponds to the construction of the first rewiring region, this will not be discussed in any greater detail.

In order to produce a component according to the invention, the above-described process steps for the production of the panel according to the invention are performed first. In an additional process step, the components are separated from the panel regions provided. The separation of the components is preferably effected by sawing up the panel, the sawing areas producing side areas of the electronic components.

Figure 1:
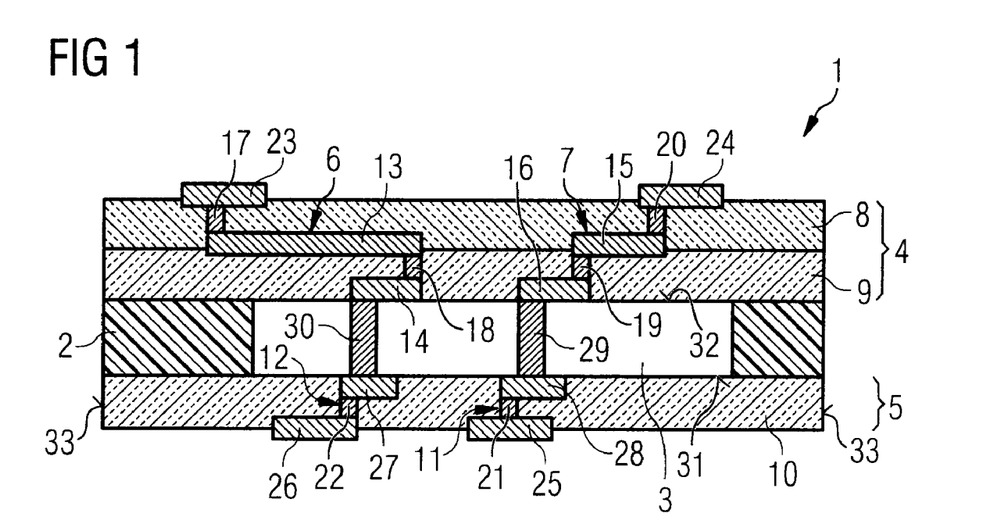
FIG. 1 illustrates a schematic cross section through an electronic component according to the invention.

FIG. 1 illustrates a schematic cross section through an electronic component 1, which is subdivided into a semiconductor chip 3, a filling layer 2 made of plastic, and also a first rewiring region 4 and a second rewiring region 5.

The semiconductor chip 3 is essentially composed of a semiconductor material such as Si or GaAs and has a chip front side 31 with electrical circuits (not shown here) and a chip rear side 32 and also a first chip through-contact 29 and a second chip through-contact 30. The chip through-contacts 29, 30 extend from the chip rear side 32 as far as the chip front side 31 and are filled with electrically conductive material—such as copper, aluminum, tungsten, tin, gold or alloys thereof. The chip front side 31 and the chip rear side 32 additionally have contact areas, which are not shown here.

The semiconductor chip 3 adjoins the first rewiring region 4 with the chip rear side 32 and the second rewiring region 5 with the chip front side 31.

The semiconductor chip 3 is laterally enclosed by the filling layer 2, which terminates flush with side areas 33 of the electronic component 1.

The first rewiring region 4, which is situated on the chip rear side, is subdivided into a first insulating layer 8 and a second insulating layer 9 and also a first rewiring 6 arranged therein and a second rewiring 7. The first rewiring 6 has a first horizontal conductor track region 13, a second horizontal conductor track region 14, a first and a second through-contact 17, 18 and also a first upper external contact 23. They are formed in such a way that the first upper external contact 23 is connected to the second chip through-contact 30 via the first through-contact 17, via the first horizontal conductor track region 13, via the second through-contact 18 and via the second horizontal conductor track region 15.

The second rewiring 7 of the first rewiring region 4 has a third horizontal track region 15, a fourth horizontal conductor track region 16, a third and a fourth through-contact 19, 20 and also a second upper external contact 24. They are formed in such a way that the second upper external contact 24 is connected to the first chip through-contact 29 via the fourth through-contact 20, via the third horizontal conductor track region 15, via the third through-contact 19 and via the fourth horizontal conductor track region 16.

The second rewiring region 5 on the chip front side 31 is subdivided into a third insulating layer 10, a third rewiring 11 and a fourth rewiring 12.

The third rewiring 11 in the second rewiring region 5 has a sixth horizontal conductor track region 28 and also a fifth through-contact 21 and a first lower external contact 25. The first lower external contact 25 is electrically connected to the first chip through-contact 29 via the fifth through-contact 21 and via the sixth horizontal conductor track region 28. The fourth rewiring 12 has a fifth horizontal conductor track region 27, a sixth through-contact 22 and a second lower external contact 26. The second lower external contact 26 is electrically connected to the second chip through-contact 30 via the sixth through-contact 22 and the fifth horizontal conductor track region 27.

The horizontal conductor tracks 13, 14, 15, 16, 27, 28 and also the external contacts 23, 24, 25, 26 are preferably formed from sputtered or galvanically grown copper or aluminum, tungsten, gold, Sn or alloys thereof including these materials, the external contacts 23, 24, 25, 26 having an additional surface coating, which is not illustrated here. This surface coating serves for the further processability of the external contacts 23, 24, 25, 26 and usually has a tin-silver, nickel-gold coating and also an additional optional organic protective layer for preventing the oxidation of the external contacts 23, 24, 25, 26.

The total thickness of the rewiring regions 4, 5 may in each case lie in the range of a few to 10 μm.

FIGS. 2-7 illustrate the process steps for the production of the electronic component 1 according to the invention from FIG. 1.

Figure 2:
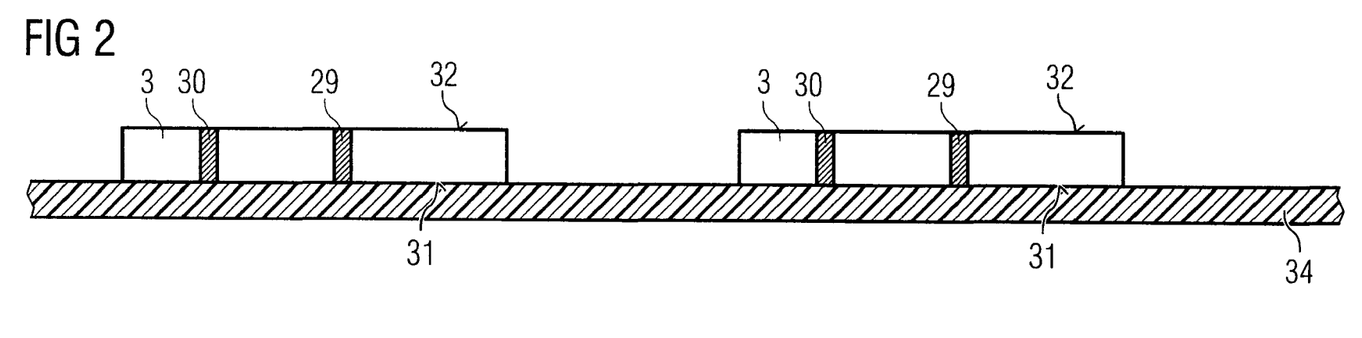
FIGS. 2-7 illustrate individual partial process steps for the production of an electronic component according to the invention.

FIG. 2 illustrates a first partial process step for the production of the component 1 according to the invention. A carrier substrate 34 has been populated with semiconductor chips 3 according to the invention in a preceding process, the semiconductor chips already having the chip through-contacts 29, 30. The semiconductor chips 3 lie at a distance from one another with the chip front side 31 on the carrier substrate 34.

A substrate made of glass, silicon or else made of metal such as nickel is used as the carrier substrate 34, the top side of the substrate being covered with a thermally active adhesive layer (not shown here), which loses its adhesive strength upon heating. The carrier substrate 34 is situated on a flat handling device (likewise not shown here).

Figure 3:
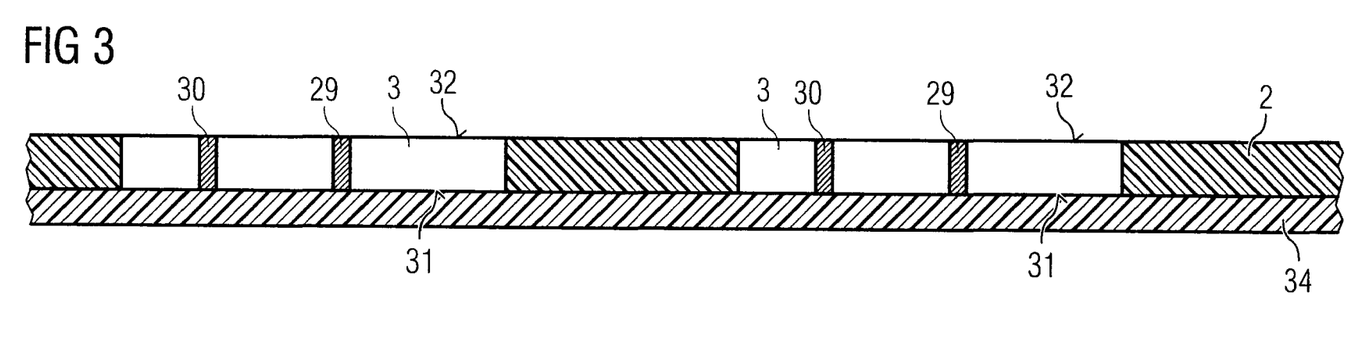

In FIG. 3, the space between the semiconductor chips 3 situated on the carrier substrate 16 has been filled with the filling layer 2 in a preceding process by means of the film molding method. In this method, a mold is placed onto the substrate populated with the semiconductor chips 3, a compliant film being positioned between the chip rear sides 32 and the mold cover in order that, on the one hand, the semiconductor chips 3 are not damaged and, on the other hand, a good sealing of the mold at the chip rear side 32 is obtained.

The chip rear sides 32 terminate flush with the upper area of the plastics composition of the filling layer 2.

Figure 4:
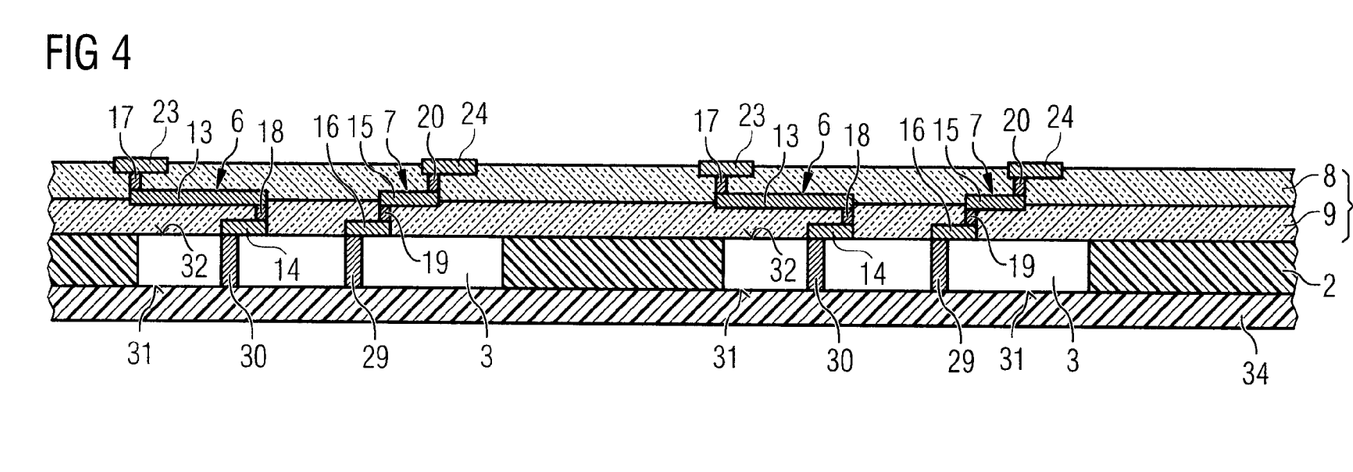

FIG. 4 illustrates how the first rewiring region 4 having rewirings 6, 7, through-contacts 17, 18, 19, 20 and insulating layers 8, 9 has been built up on the chip rear side 32 and on the upper area of the plastics composition 2 by means of the build-up method. In the build-up method, the rewiring region 4 is built up layer by layer using thin-film technology. In this technology, all the layers are patterned photolithographically. In this case, photosensitive layers are usually applied as insulating layers 8, 9 by spin-coating. The conductor track regions 13, 14, 15, 16 are deposited by sputtering or vapor deposition and patterned by etching in a subsequent process. As an alternative, conductor track regions 13, 14, 15, 16 may be grown galvanically on a sputtered intermediate layer and then be patterned by etching.

Figure 5:
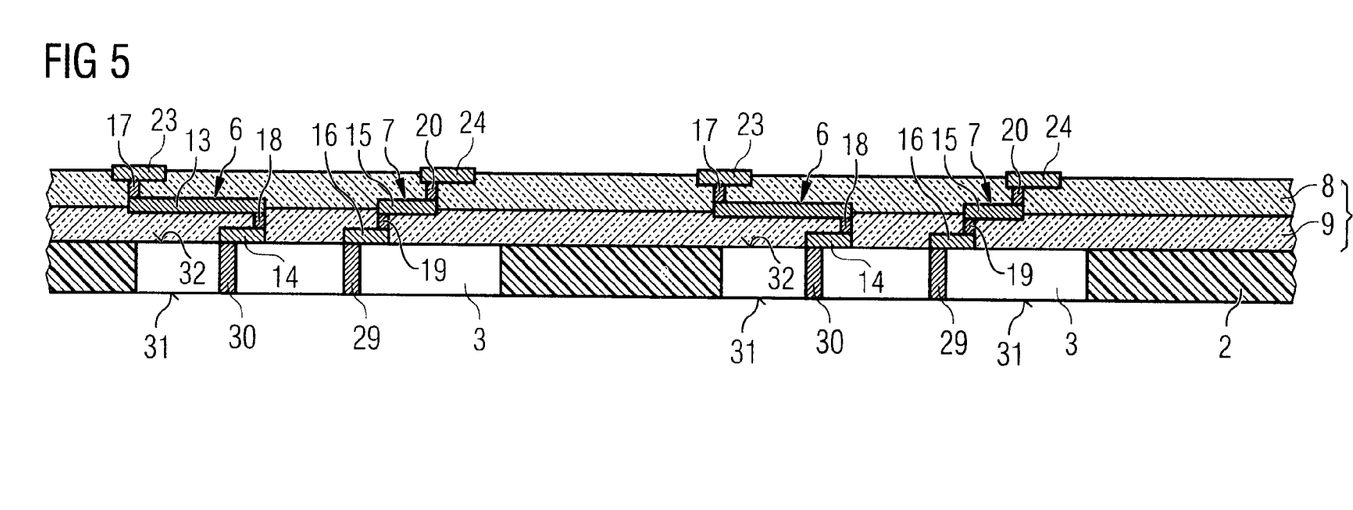

FIG. 5 illustrates a further process for the production of the component 1 according to the invention after the carrier substrate 34 has been separated from the remainder by heating. The chip front side 31 is thereby uncovered for further processing.

Figure 6:
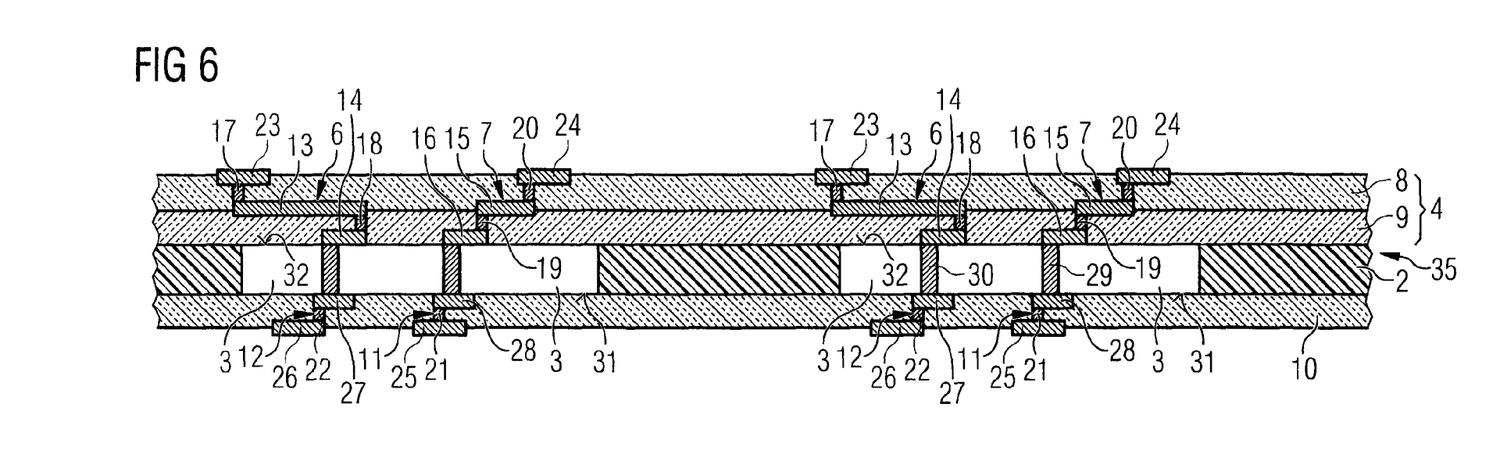

In FIG. 6, the chip front side 31 and the lower surface of the filling layer 2 are also provided with a further rewiring region 5. This is effected analogously to the method described with reference to FIG. 4. The entire construction is rotated beforehand and thus placed onto a handling device.

Figure 7:
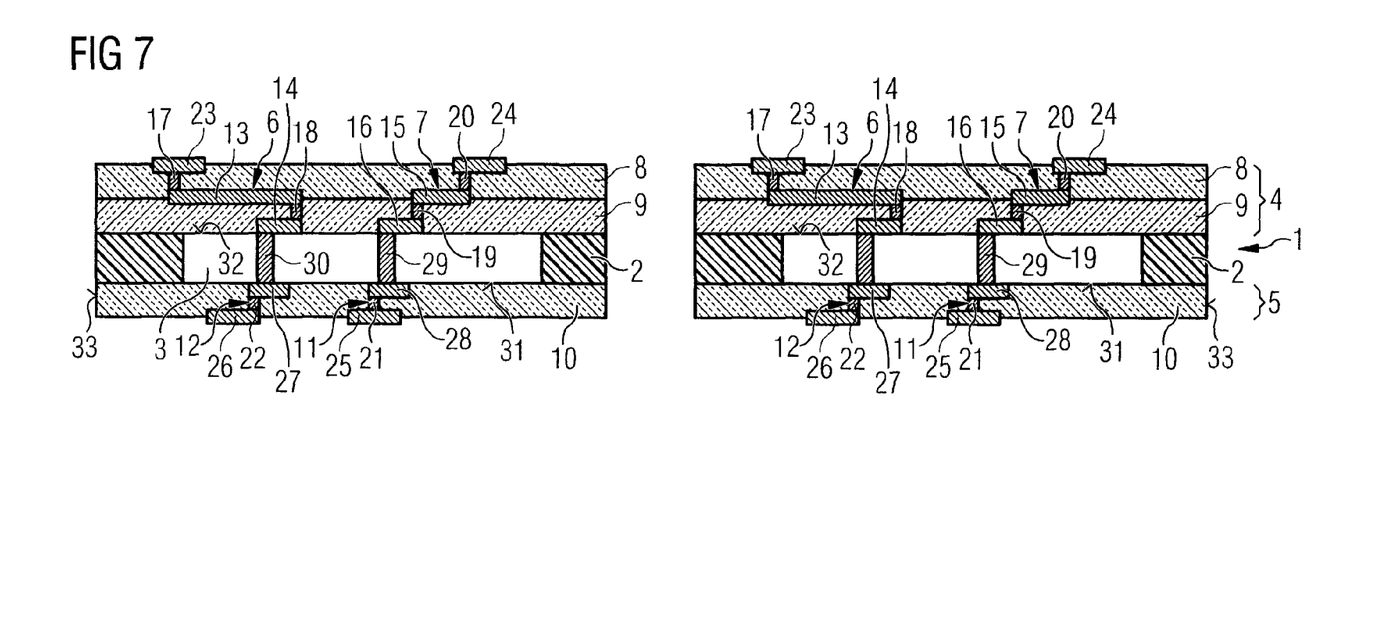

FIG. 7 illustrates the electronic components 1 produced by sawing up the panel. In this case, the sawing areas produce the side areas 33 of the electronic components 1.

Figure 8:
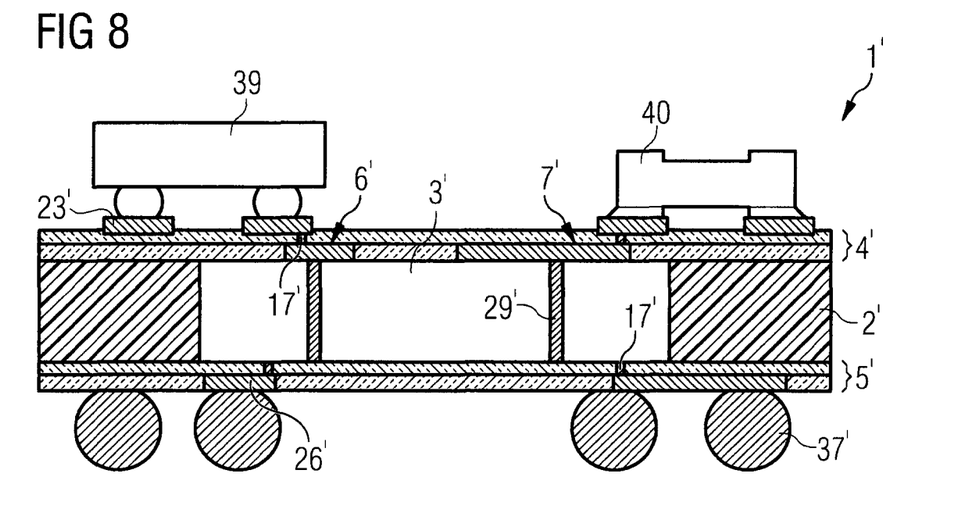
FIG. 8 illustrates a schematic cross section through a further electronic component according to the invention.

FIG. 8 illustrates a cross section through an electronic component exhibiting the invention. The component illustrated here substantially corresponds to the electronic component from FIG. 1. Identically acting parts therefore have the same reference numerals, but provided with an apostrophe. In this case, the component 1' is equipped with balls 37' and with further external components 39, 40, the balls 37' being fitted to the lower external contacts 26' of the second rewiring region 5' on the lower side of the component 1' and the external components 39, 40 being placed on the upper external contacts 23' of the first rewiring region 4' on the upper side of the electronic component 1'.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A panel for the production of electronic components, the panel having component regions from which a respective component can be separated, wherein the component regions comprising:
   a semiconductor chip having a chip front side with active circuit structures, a chip rear side and one or more chip through-contacts which extend between the chip rear side and the chip front side and which are provided with electrically conductive material;
   a filling layer made of plastic which encapsulates side regions of the semiconductor chip between the chip front side and the chip rear side, wherein a front side of the filling layer is coplanar with the chip front side and a rear side of the filling layer is coplanar with the chip rear side;
   a second rewiring region disposed on the chip front side and on the front side of the filling layer, the second rewiring region subdivided into at least one insulating layer having a rewiring with external contacts arranged therein; and
   a first rewiring region disposed directly on the chip rear side and on the rear side of the filling layer and electrically connected to the second rewiring region via the one or more chip-through-contacts, the first rewiring region subdivided into at least one insulating layer having a rewiring with external contacts arranged therein.

2. The panel as claimed in claim 1, comprising wherein the semiconductor chip is planar and has a lateral edge and one or more of the external contacts of the first and second rewiring regions project at least partly laterally beyond the edge of the semiconductor chip.

3. The panel as claimed in claim 1, comprising wherein the chip through-contacts are made of at least one of the following materials: copper, aluminum, tungsten, tin, gold or an alloy comprising these materials.

4. The panel as claimed in claim 1, comprising wherein the rewiring has at least one horizontal conductor track region and at least one through-contact.

5. The panel as claimed in claim 1, comprising wherein the horizontal conductor track regions include sputtered or galvanically grown copper or aluminum, tungsten, tin, gold or an alloy comprising these materials.

6. The panel as claimed in claim 1, comprising wherein the external contacts have an additional copper-tin or nickel-gold surface coating.

7. The panel as claimed in claim 1, comprising wherein the external contacts have an organic protective coating.

8. An electronic component comprising a component region which has been separated by sawing from the panel of claim 1.

9. The electronic component as claimed in claim 8, including the filling layer encapsulating the side regions of the semiconductor chip.

10. A panel for the production of electronic components, comprising:
   a semiconductor chip having a chip front side with active circuit structures, a chip rear side and one or more chip through-contacts which extend between the chip rear side and the chip front side and which are provided with electrically conductive material; and
   at least one rewiring region subdivided into at least one insulating layer and also a rewiring arranged therein, the rewiring having external contacts, wherein the at least one rewiring region includes:
   a second rewiring region disposed on the chip front side, the second rewiring region subdivided into at least one insulating layer having a rewiring with external contacts arranged therein; and
   a first rewiring region disposed directly on the chip rear side and electrically connected to the second rewiring region via the one or more chip through-contacts, and the first rewiring region subdivided into at least one insulating layer having a rewiring with external contacts arranged therein.

11. The panel as claimed in claim 10, wherein the panel includes a filling layer made of plastic which encapsulates the semiconductor chip in a side region between the chip front side and the chip rear side and which is connected to the first and second rewiring regions, wherein the second rewiring region is further disposed on a front side of the filling layer and the first rewiring region is further disposed on a rear side of the filling layer.

12. The panel as claimed in claim 11, comprising wherein the semiconductor chip is planar and has a lateral edge and one or more of the external contacts projects at least partly laterally beyond the edge of the semiconductor chip.

13. The panel as claimed in claim 12, comprising wherein the rewiring has at least one horizontal conductor track region and at least one through-contact.

14. The panel as claimed in claim 13, comprising wherein the horizontal conductor track regions include sputtered or galvanically grown copper or aluminum, tungsten, tin, gold or an alloy comprising these materials; and wherein the external contacts have an additional copper-tin or nickel-gold surface coating.

* * * * *